(12) United States Patent
Yang (10) Patent No.: US 10,107,558 B2
(45) Date of Patent: Oct. 23, 2018

(54) THERMAL MODULE

(71) Applicant: ASIA VITAL COMPONENTS CO., LTD., New Taipei (TW)

(72) Inventor: Hsiu-Wei Yang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 705 days.

(21) Appl. No.: 14/016,219

(22) Filed: Sep. 2, 2013

(65) Prior Publication Data

US 2015/0060020 A1 Mar. 5, 2015

(51) Int. Cl.
*F28D 15/04* (2006.01)
*F28D 15/02* (2006.01)
*H01L 23/427* (2006.01)

(52) U.S. Cl.
CPC ......... *F28D 15/04* (2013.01); *F28D 15/0275* (2013.01); *H01L 23/427* (2013.01); *H01L 2924/0002* (2013.01)

(58) Field of Classification Search
CPC .... F28D 15/046; F28D 15/04; F28D 15/0266; F28D 15/0233; F28D 15/0275; F04D 29/444; H01L 23/427; H01L 2924/0002
USPC .............................. 165/104.26, 80.3, 104.33
See application file for complete search history.

(56) References Cited

U.S. PATENT DOCUMENTS

| | | | | |
|---|---|---|---|---|
| 4,951,740 | A * | 8/1990 | Peterson | F28D 15/046 165/104.26 |
| 5,253,702 | A * | 10/1993 | Davidson | F28D 15/0233 165/104.14 |
| 2006/0162905 | A1* | 7/2006 | Hsu | F28D 15/046 165/104.26 |
| 2007/0022603 | A1* | 2/2007 | Chuang | B23P 15/26 29/890.032 |
| 2007/0272399 | A1* | 11/2007 | Nitta | F28D 15/0233 165/185 |

FOREIGN PATENT DOCUMENTS

| | | |
|---|---|---|
| TW | 216837 B | 12/1993 |
| TW | M380703 U1 | 5/2010 |
| TW | M413899 U1 | 10/2011 |

* cited by examiner

*Primary Examiner* — Raheena R Malik
(74) *Attorney, Agent, or Firm* — C. G. Mersereau; Nikolai & Mersereau, P.A.

(57) ABSTRACT

A thermal module includes a housing having multiple independent compartments not in communication with each other. Each compartment communicates with an open end of at least one heat pipe. The open end communicates with a heat pipe chamber in the heat pipe, whereby the independent compartments communicate with the heat pipe chambers.

13 Claims, 11 Drawing Sheets

THERMAL MODULE

BACKGROUND OF THE INVENTION

1. Field of the Invention

The present invention relates generally to a thermal module, and more particularly to a thermal module capable of providing excellent heat dissipation effect for a heat source over which the heat is non-uniformly distributed.

2. Description of the Related Art

There is a trend to develop thinner and thinner electronic apparatuses nowadays. The ultra-thin electronic apparatus includes miniaturized components. The heat generated by the miniaturized components of the electronic apparatus has become a major obstacle to having better performance of the electronic apparatus and system. In order to solve the heat dissipation problem of the components in the electronic apparatuses, various vapor chambers and heat pipes with better heat conduction performance have been developed.

The vapor chamber has a rectangular housing and capillary structures formed on inner wall face of the chamber of the housing. A working fluid is filled in the housing. One face (the evaporation section) of the housing is attached to a heat generation component (such as a central processor, a Northbridge/Southbridge chipset or a transistor) to absorb the heat generated by the heat generation component. Accordingly, the liquid working fluid in the evaporation section of the housing evaporates into vapor working fluid to transfer the heat to the condensation section of the housing. The vapor working fluid is cooled and condensed into liquid phase. Under gravity or capillary attraction of the capillary structures, the liquid working fluid flows back to the evaporation section for next vapor-liquid circulation. Accordingly, the heat can be spread and dissipated.

The working principle of the heat pipe is similar to that of the vapor chamber. Metal powder is filled into the interior of a hollow circular tube. Then the metal powder is sintered to form an annular capillary structure on inner wall face of the heat pipe. Then the heat pipe is vacuumed and a working fluid is filled into the heat pipe. Finally, the heat pipe is sealed to form the heat pipe structure. The liquid working fluid in the evaporation section of the housing is heated to evaporate into vapor working fluid. The vapor working fluid diffuses to the condensation end to transfer the heat to the condensation end. During the diffusion, the vapor working fluid is gradually cooled and condensed into liquid phase. Under capillary attraction of the capillary structure, the liquid working fluid flows back to the evaporation section for next vapor-liquid circulation.

In comparison with the vapor chamber, the heat pipe conducts heat in a different manner. The vapor chamber serves to two-dimensionally face-to-face transfer heat, while the heat pipe serves to one-dimensionally transfer heat.

In generally, the heat generated by the chip is concentrated on the surface. However, the heat may be non-uniformly distributed over the surface. This is because the integrated components of the chip are arranged in the chip by different densities. It has become a critical topic how to more efficiently dissipate the heat non-uniformly distributed over the surface of the chip to achieve better heat dissipation effect for the high-power electronic components.

SUMMARY OF THE INVENTION

It is therefore a primary object of the present invention to provide a thermal module including a housing having multiple independent compartments. Each of the independent compartments communicates with the heat pipe chamber of a heat pipe, whereby the thermal module can provide both the heat spreading function of a vapor chamber and the remote end heat transfer function of a heat pipe.

It is a further object of the present invention to provide the above thermal module in which after heated, multiple vapor-liquid circulations of working fluids independently take place within the independent compartments and the heat pipe chambers to transfer heat.

It is still a further object of the present invention to provide the above thermal module in which multiple heat pipes are respectively connected to the independent compartments, whereby multiple vapor-liquid circulations of working fluids independently take place within the independent compartments and the heat pipe chambers to transfer heat without interfering with each other.

It is still a further object of the present invention to provide the above thermal module, which is able to provide best heat dissipation effect for a heat source over which the heat is non-uniformly distributed.

It is still a further object of the present invention to provide the above thermal module in which the independent compartments communicate with the heat pipe chambers of the heat pipes to enlarge the capacity of the compartments so as to increase the amount of the working fluid contained in the compartments, whereby the maximum heat transfer (Qmax) of the heat pipe is increased.

It is still a further object of the present invention to provide the above thermal module, which not only can two-dimensionally transfer heat, but also can one-dimensionally transfer heat.

To achieve the above and other objects, the thermal module of the present invention includes a housing having multiple independent compartments not in communication with each other. Each compartment communicates with an open end of at least one heat pipe. The open end communicates with a heat pipe chamber in the heat pipe, whereby the independent compartments communicate with the heat pipe chambers.

To speak more specifically, the thermal module of the present invention includes: a housing having multiple independent compartments not in communication with each other, each compartment containing therein a working fluid; and multiple independent first heat pipes. Each first heat pipe is connected with one of the independent compartments. Each first heat pipe has a first open end and a first closed end opposite to the first open end. The first heat pipe defines a first heat pipe chamber therein in communication with the first open end. The first open end and the first heat pipe chamber communicate with the compartment, whereby vapor-liquid circulations of the working fluids contained in the independent compartments independently take place within the independent compartments and the first heat pipe chambers to transfer heat.

The above thermal module further includes multiple independent second heat pipes. Each second heat pipe is connected with one of the independent compartments. Each second heat pipe has a second open end and a second closed end opposite to the second open end. The second heat pipe defines a second heat pipe chamber therein in communication with the second open end. The second open end and the second heat pipe chamber communicate with the compartment, whereby vapor-liquid circulations of the working fluids contained in the independent compartments independently take place within the independent compartments and the second heat pipe chambers to transfer heat.

In the above thermal module, at least one partitioning board is disposed between the independent compartments to isolate the independent compartments. The first and second heat pipes are circular heat pipes, flat-plate heat pipes, D-shaped heat pipes or semicircular heat pipes.

In the above thermal module, the housing has a top section and a bottom section. The independent compartments are positioned between the top section and the bottom section and isolated from each other in horizontal direction. One face of the top section serves as a top face of the independent compartments and one face of the bottom section serves as a bottom face of the independent compartments. The other face of the bottom section is a heat contact face.

In the above thermal module, the housing is formed with multiple perforations in communication with the independent compartments respectively. The first open ends of the first heat pipes are connected to the perforations respectively.

In the above thermal module, the housing is formed with multiple perforations in communication with the independent compartments respectively. The first open ends of the first heat pipes and the second open ends of the second heat pipes are connected to the perforations respectively.

In the above thermal module, the independent compartments have equal or unequal capacities.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The embodiments of the present invention will be described hereinafter with reference to the drawings, wherein the same components are denoted with the same reference numerals.

Figure 1:
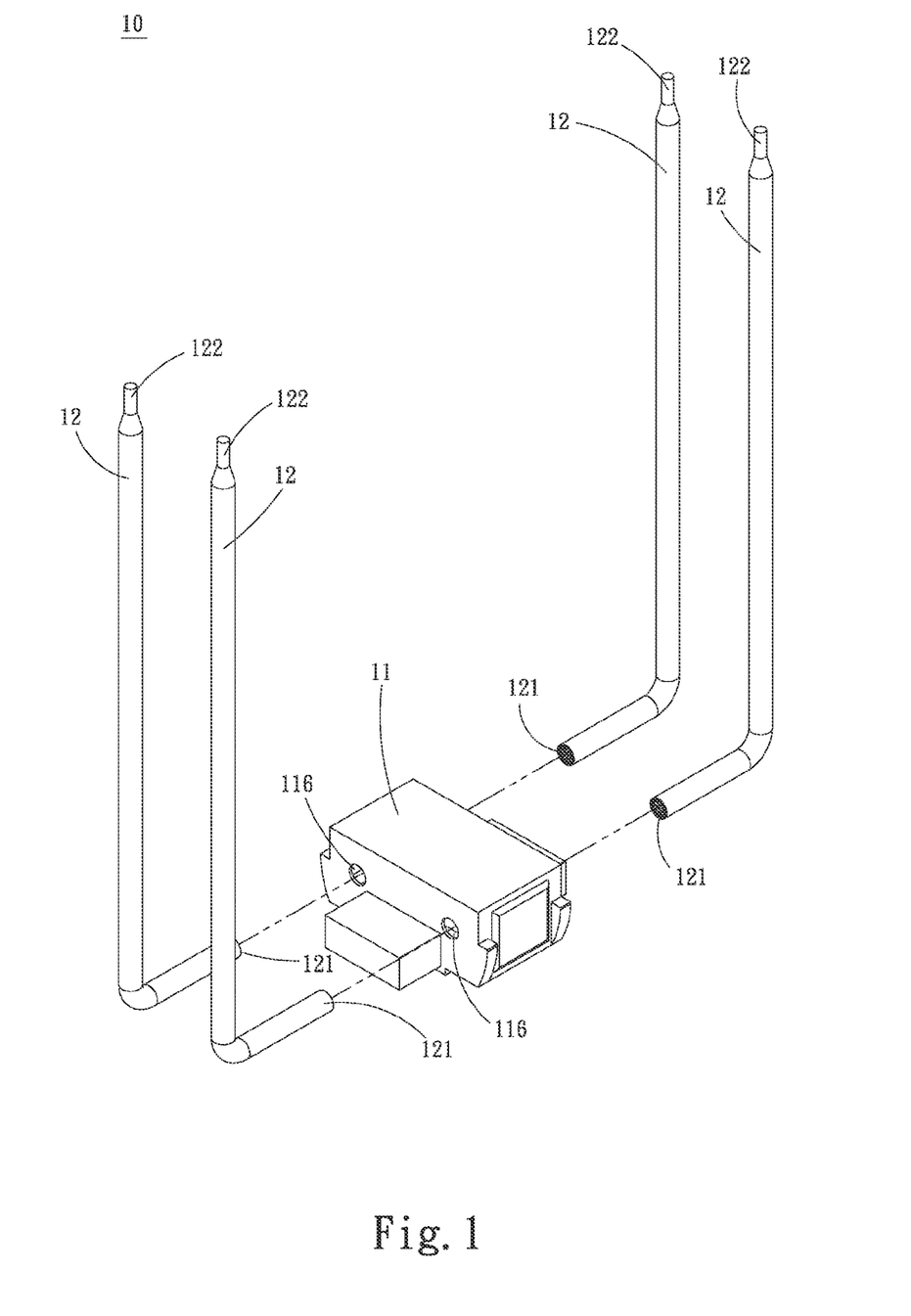
FIG. 1 is a perspective exploded view of a first embodiment of the thermal module of the present invention.
Figure 2:
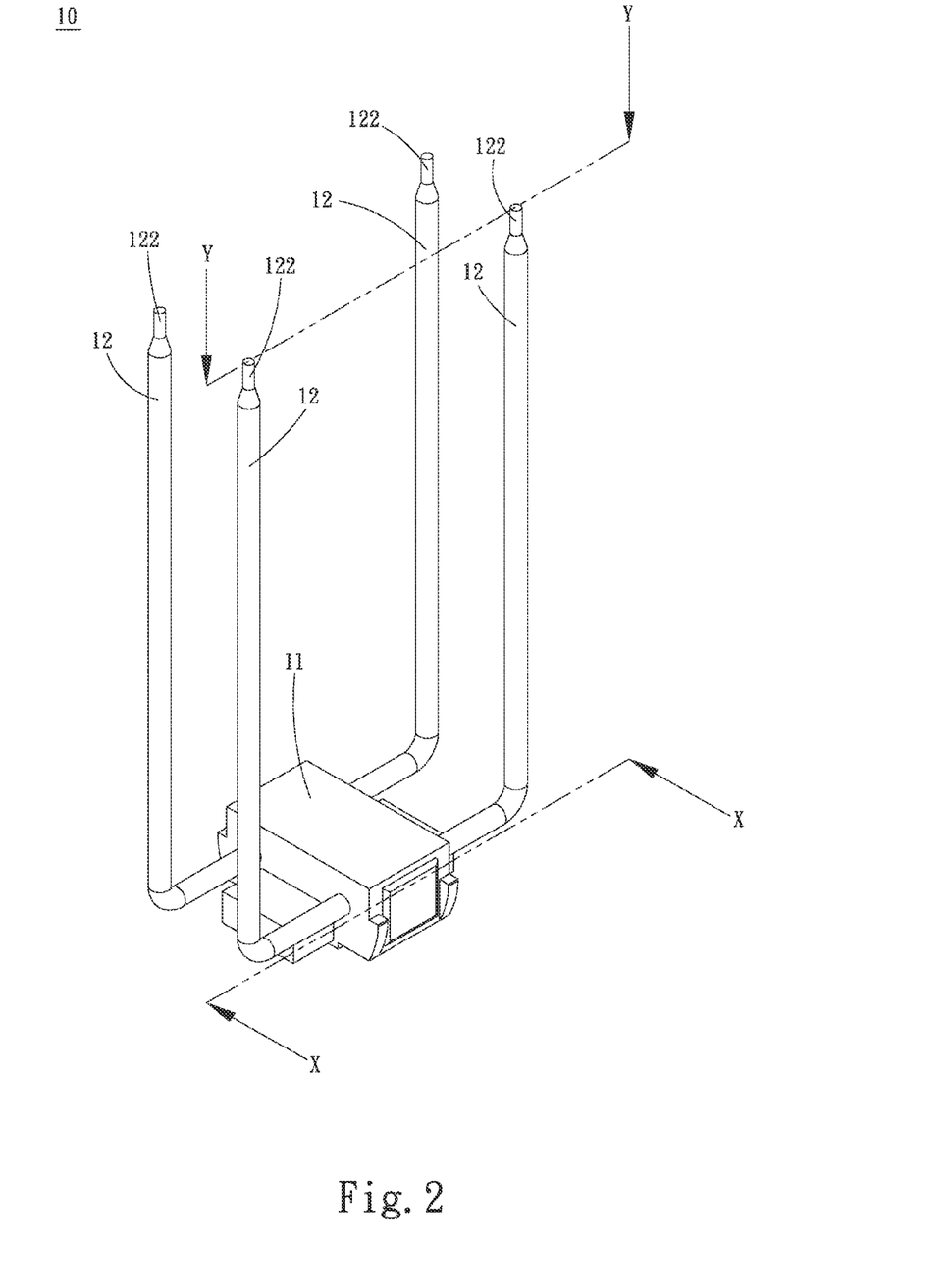
FIG. 2 is a perspective assembled view of the first embodiment of the thermal module of the present invention.
Figure 3:
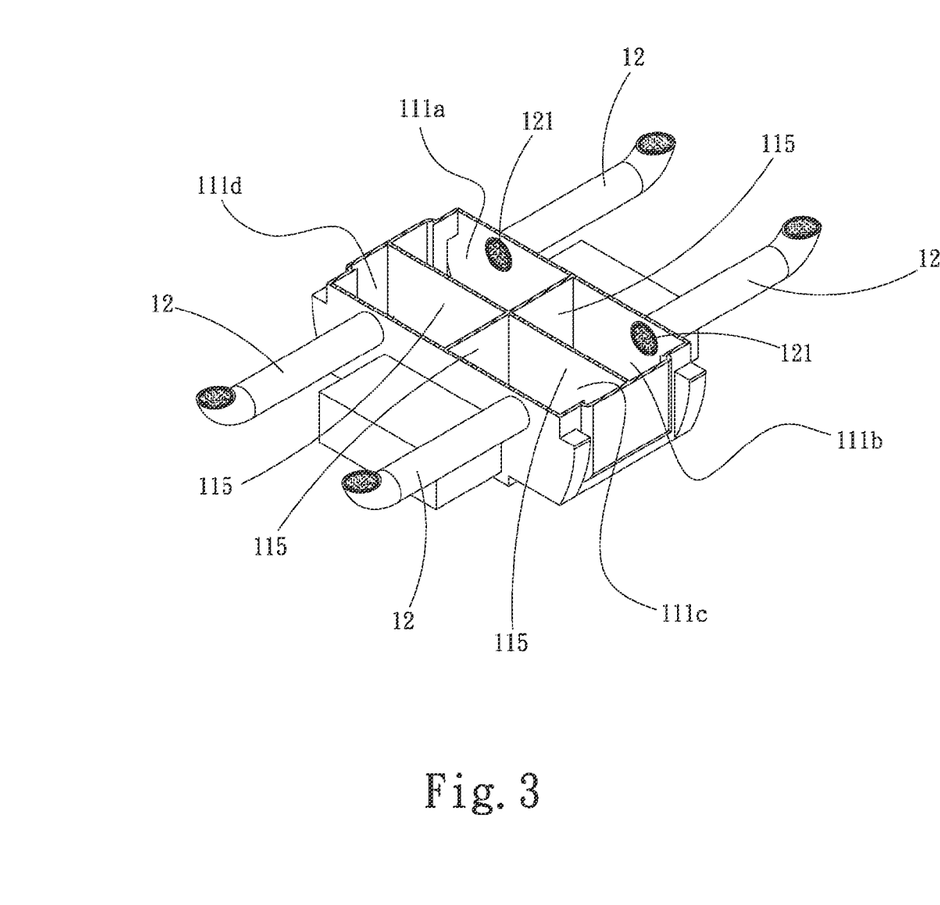
FIG. 3 is a sectional view taken along line X-X of FIG. 2.
Figure 4:
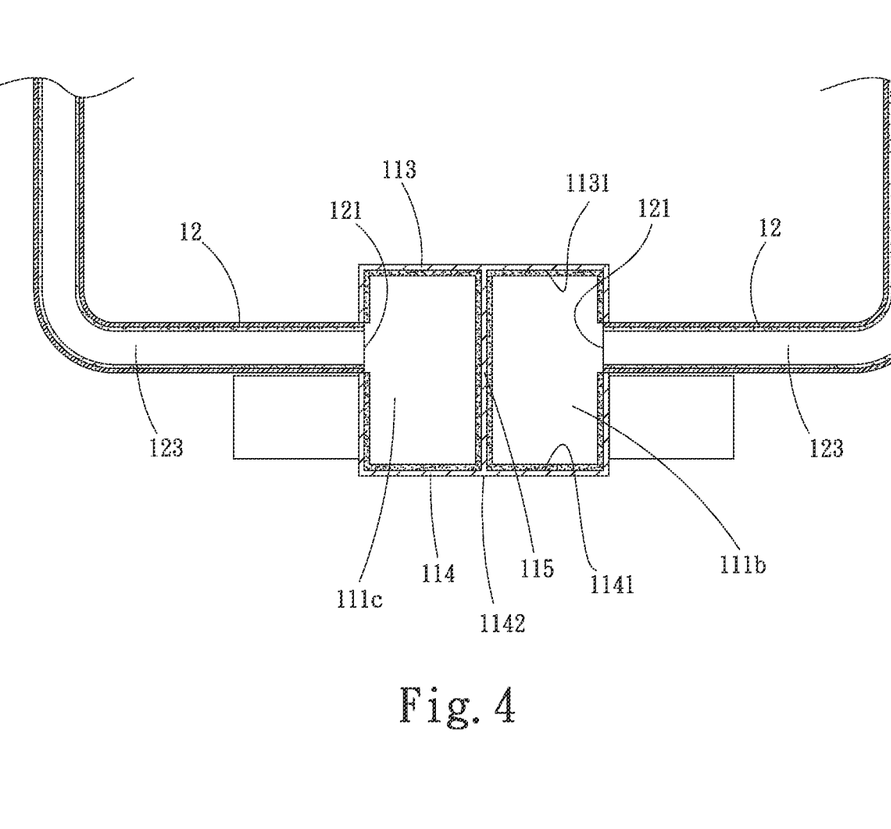
FIG. 4 is a sectional view taken along line Y-Y of FIG. 2.

Please refer to FIGS. 1 to 4. FIG. 1 is a perspective exploded view of the present invention. FIG. 2 is a perspective assembled view of the present invention. FIG. 3 is a sectional view taken along line X-X of FIG. 2. FIG. 4 is a sectional view taken along line Y-Y of FIG. 2. The thermal module 10 of the present invention includes a housing 11 having several independent compartments 111a~111d not in communication with each other. Each compartment 111a~111d communicates with an open end of at least one heat pipe. The open end communicates with a heat pipe chamber in the heat pipe, whereby the independent compartments 111a~111d communicate with the heat pipe chambers.

The housing 1 is made of a material with excellent thermal conductivity, such as metal or plastic material. The housing 1 has a top section 113 and a bottom section 114. The independent compartments 111a~111d are positioned between the top section 113 and the bottom section 114. One face of the top section 113, which face is proximal to the independent compartments, serves as a top face 1131 of the independent compartments 111a~111d. One face of the bottom section 114, which face is proximal to the independent compartments, serves as a bottom face 1141 of the independent compartments 111a~111d. The other face of the bottom section 114 is a heat contact face 1142 for contacting at least one heat source 20. At least one partitioning board 115 is disposed between the independent compartments 111a~111d positioned between the top section 113 and the bottom section 114. Upper and lower ends of the partitioning board 115 are connected with the top section 113 and the bottom section 114, whereby the independent compartments 111a~111d are isolated from each other in horizontal direction without communicating with each other. The housing 11 is formed with multiple perforations 116 in communication with the independent compartments 111a~111d respectively. In this embodiment, there are four independent compartments 111a~111d. Therefore, the housing 11 is formed with four perforations 116 in communication with the independent compartments 111a~111d respectively. A working fluid is contained in each independent compartment 111a~111d. In addition, a capillary structure layer is disposed on inner wall face of each independent compartment 111a~111d.

In this embodiment, there are four independent first heat pipes 12. The first heat pipes 12 are connected with the independent compartments 111a~111d respectively. Each first heat pipe 12 has a first open end 121 and a first closed end 122 opposite to the first open end 121. The first heat pipe 12 defines a first heat pipe chamber 123 therein in communication with the first open end 121. The first open end 121 is connected to the perforation 116, whereby the first heat pipe chamber 123 of the first heat pipe 12 communicates with the compartment 111a~111d. A capillary structure layer is disposed on inner wall face of the first heat pipe chamber 123. The first heat pipe chamber 123 communicates with the compartment 111a~111d so that vapor-liquid circulation of the working fluid contained in the compartment 111a~111d can take place in each compartment 111a~111d and each first heat pipe chamber 123 to transfer heat. The respective independent compartments 111a~111d and the first heat pipes 123 in communication therewith will not interfere with each other. In this embodiment, four independent compartments 111a~111d communicate with four first heat pipes 123 respectively. Therefore, when the housing 11 is heated, four independent vapor-liquid circulations will take place to transfer heat.

Figure 5:
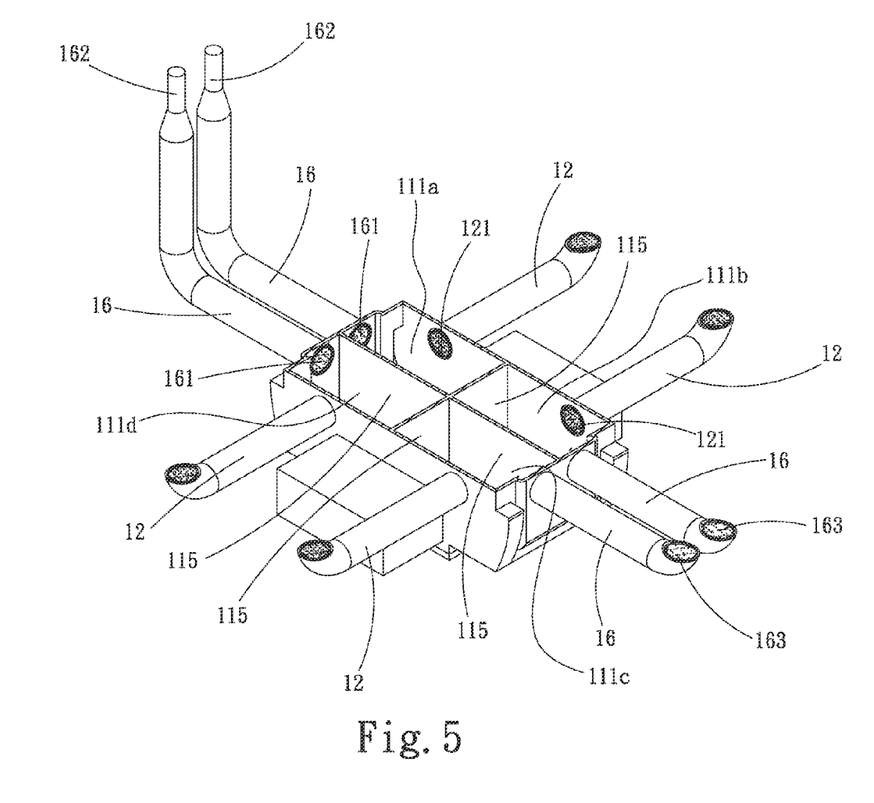
FIG. 5 is a sectional view of a second embodiment of the thermal module of the present invention.

In the above embodiment, each independent compartment 111a~111d is connected with a first heat pipe 12. However, the number of the heat pipes connected with the independent compartment 111a~111d is not limited. FIG. 5 is a sectional view of a second embodiment of the present invention. In the second embodiment, each independent compartment 111a~111d is further connected with a second heat pipe 16 in addition to the first heat pipe 12. Each second heat pipe 16 has a second open end 161 and a second closed end 162 opposite to the second open end 161. The second heat pipe 16 defines a second heat pipe chamber 163 therein in communication with the second open end 161. The second open end 161 and the second heat pipe chamber 163 communicate with the compartment 111a~111d so that vapor-liquid circulation of the working fluid contained in the compartment 111a~111d can take place in each compartment 111a~111d and each first heat pipe chamber 123 and each second heat pipe chamber 163 to transfer heat.

It should be noted that in this embodiment, the first and second heat pipes 12, 16 are, but not limited to, circular heat pipes. Alternatively, the first and second heat pipes 12, 16 can be flat-plate heat pipes.

The application of the present invention will be described hereinafter to more clearly illustrate the present invention.

Figure 6A:
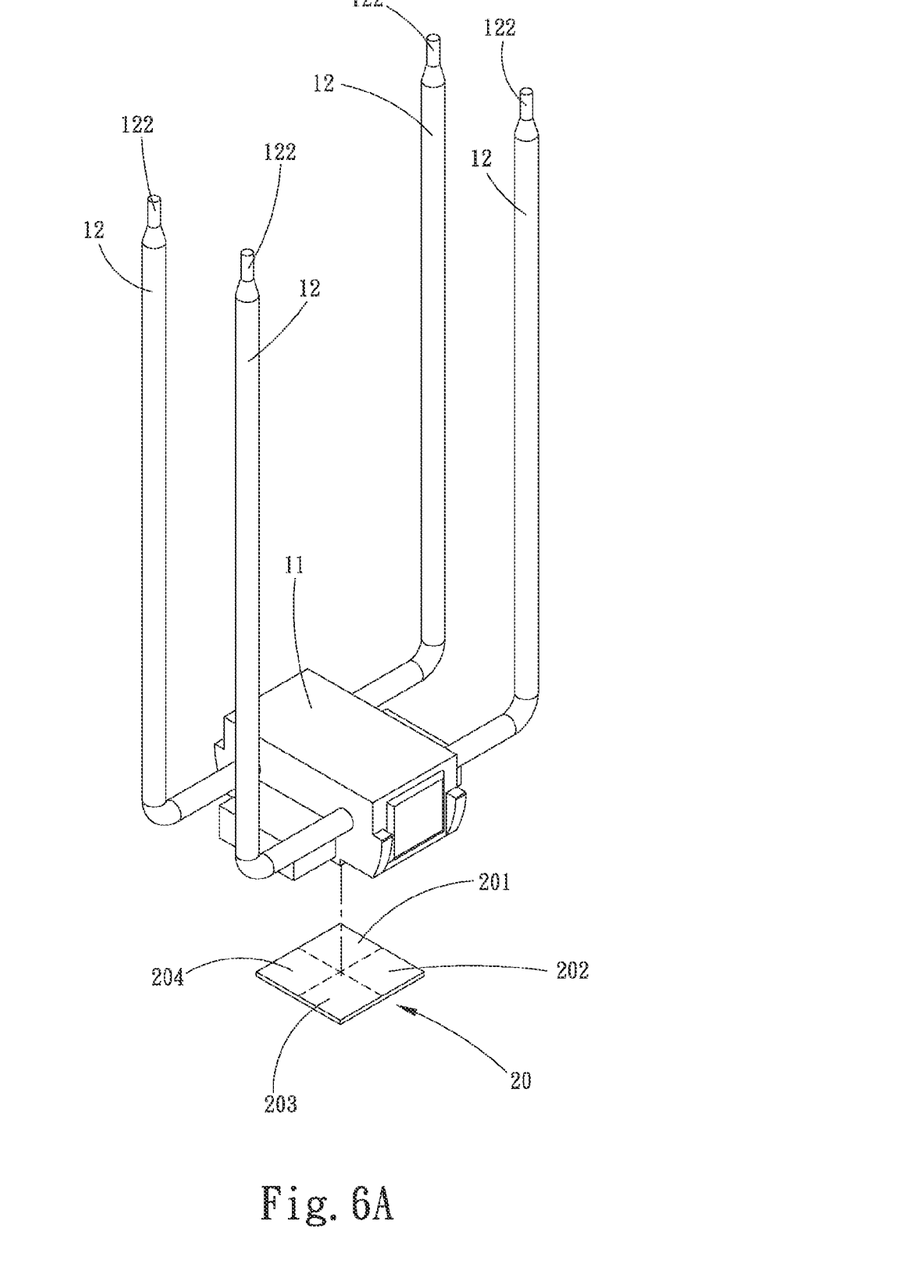
FIG. 6A is a perspective view showing that the thermal module of the present invention is applied to a heat source.
Figure 6B:
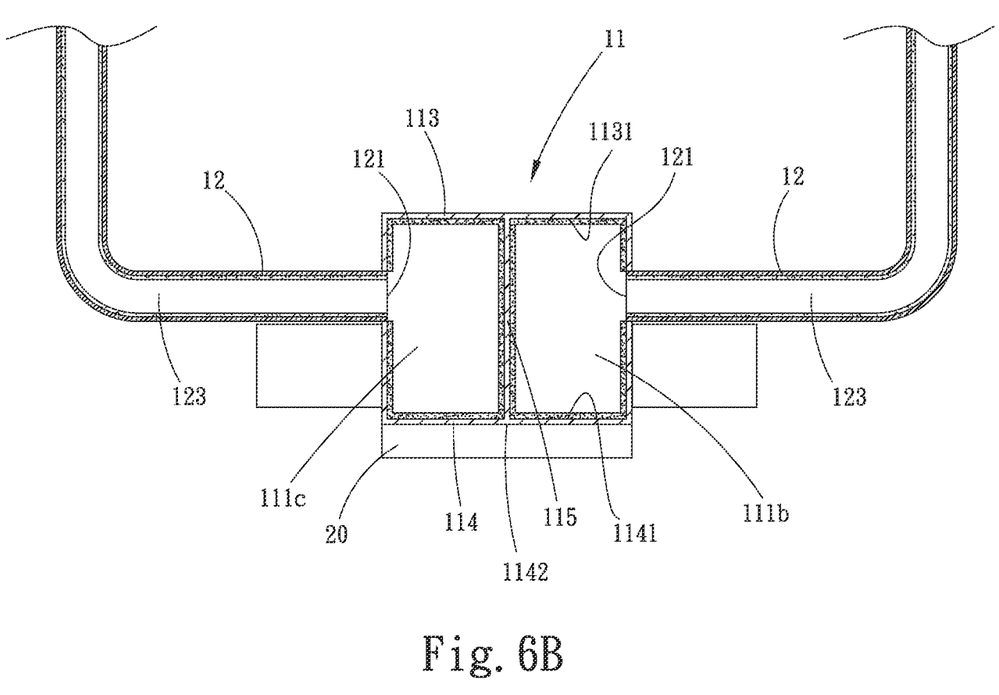
FIG. 6B is a horizontally sectional view showing that the thermal module of the present invention is in contact with a heat source.
Figure 6C:
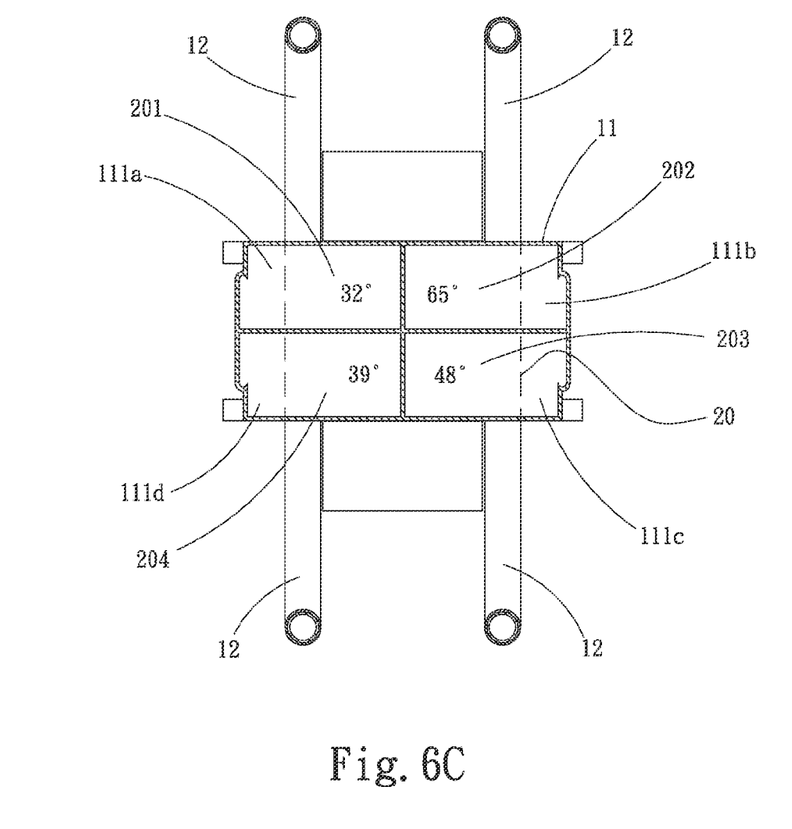
FIG. 6C is a vertically sectional view showing that the thermal module of the present invention is in contact with a heat source.

As shown in FIGS. 6A to 6C, the heat contact face 1142 of the bottom section 114 of the housing 11 is in contact with the surface of at least one heat source 20 (such as a CPU or an MCU). For easy illustration, the surface of the heat source 20 is substantially divided into four sections, that is, first to fourth sections 201~204. In practical operation, the temperatures of the first to fourth sections 201~204 of the surface of the heat source are different. For example, the temperature of the first section 201 is 32 degrees, the temperature of the second section is 65 degrees, the temperature of the third section is 48 degrees, while the temperature of the fourth section is 39 degrees (as shown in FIG. 6C).

The independent compartments 111a~111d of the housing 11 are respectively in alignment with the first to fourth sections 201~204 of the surface of the heat source 20 through the bottom section 114 of the housing 11. The independent compartments 111a~111d are heated, whereby the working fluids contained therein change between liquid phase and vapor phase. Accordingly, vapor-liquid circulation of the working fluids will take place within the respective compartments 111a~111d and the first heat pipe chambers 123 of the first heat pipes 12.

To speak more specifically, the working fluid contained in the first compartment 111a absorbs the heat of the first section 201 to evaporate into vapor phase. The vapor working fluid moves toward the first heat pipe chamber 123 of the first heat pipe 12 to carry the heat of the first section 201 of the surface of the heat source 20 to the first heat pipe chamber 123. The vapor working fluid is condensed at the closed end 121 of the first heat pipe 12 back into liquid phase. Then the liquid working fluid goes back into the compartment 111a along the capillary structure in the first heat pipe chamber 123.

The working fluid contained in the second compartment 111b absorbs the heat of the second section 202 to evaporate into vapor phase. The vapor working fluid moves toward the first heat pipe chamber 123 of the first heat pipe 12 to carry the heat of the second section 202 of the surface of the heat source 20 to the first heat pipe chamber 123. The vapor working fluid is condensed at the closed end 121 of the first heat pipe 12 back into liquid phase. Then the liquid working fluid goes back into the compartment 111b along the capillary structure in the first heat pipe chamber 123.

The working fluid contained in the third compartment 111c absorbs the heat of the third section 203 to evaporate into vapor phase. The vapor working fluid moves toward the first heat pipe chamber 123 of the first heat pipe 12 to carry the heat of the third section 203 of the surface of the heat source 20 to the first heat pipe chamber 123. The vapor working fluid is condensed at the closed end 121 of the first heat pipe 12 back into liquid phase. Then the liquid working fluid goes back into the compartment 111c along the capillary structure in the first heat pipe chamber 123.

The working fluid contained in the second compartment 111d absorbs the heat of the fourth section 204 to evaporate into vapor phase. The vapor working fluid moves toward the first heat pipe chamber 123 of the first heat pipe 12 to carry the heat of the fourth section 204 of the surface of the heat source 20 to the first heat pipe chamber 123. The vapor working fluid is condensed at the closed end 121 of the first heat pipe 12 back into liquid phase. Then the liquid working fluid goes back into the compartment 111d along the capillary structure in the first heat pipe chamber 123.

Four independent vapor-liquid circulations take place within the four independent compartments 111a~111d to transfer heat without interfering with each other. The independent compartments 111a~111d contact different sections with different temperatures so that the heat transfer performances of the vapor-liquid circulations taking place within the independent compartments 111a~111d are different.

In the above embodiment, the housing 1 is in contact with one heat source 20 for illustration purposes. Alternatively, the housing 1 can contact multiple heat sources, which are densely arranged. The independent compartments 111a~111d correspond to the heat sources respectively. Similarly, the vapor-liquid circulations can independently take place within the independent compartments to transfer heat without interfering with each other.

Figure 7:
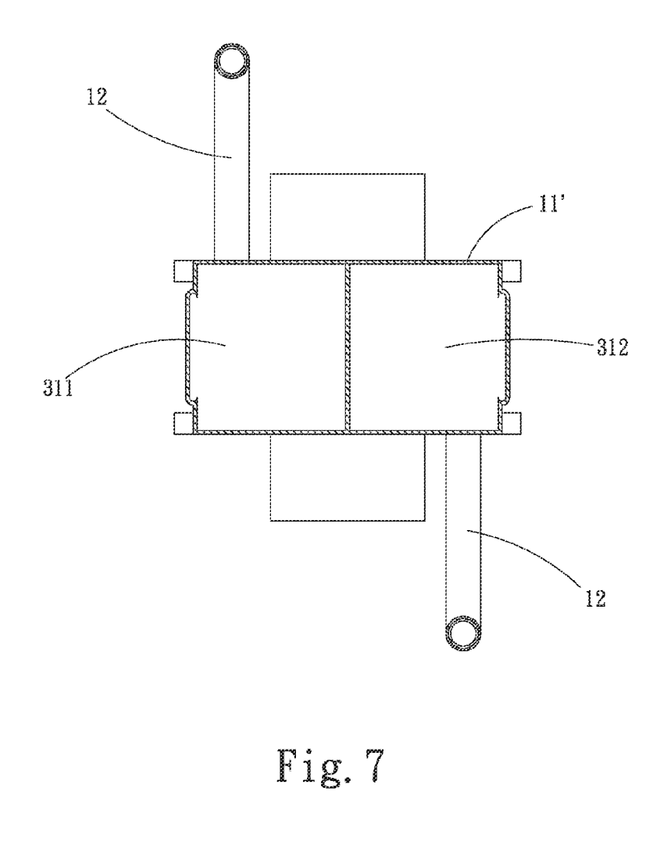
FIG. 7 is a sectional view showing that the housing of the thermal module of the present invention has two independent compartments.
Figure 8:
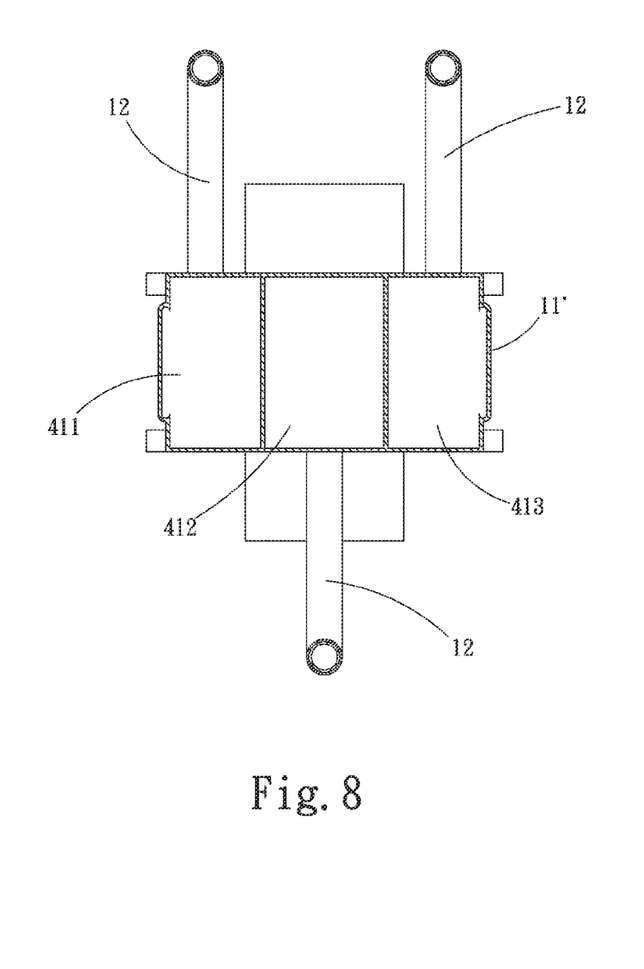
FIG. 8 is a sectional view showing that the housing of the thermal module of the present invention has three independent compartments.
Figure 9:
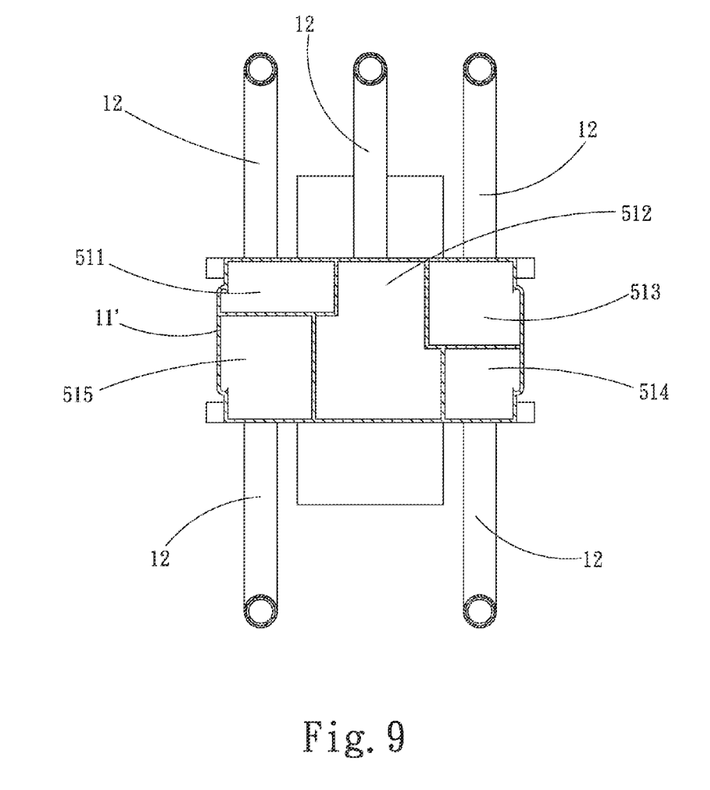
FIG. 9 is a sectional view showing that the housing of the thermal module of the present invention has five independent compartments.

It should be noted that in the above embodiments, the housing has four compartments 111a~111d with equal capacity. However, the number of the compartments is not limited. For example, as shown in FIGS. 7 to 9, according to the use and heat dissipation requirements, the housing 11' can alternatively have two independent compartments 311, 312 or three independent compartments 411, 412, 413 or five independent compartments 511, 512, 513, 514, 515 with equal or unequal capacities. Moreover, according to the capacities of the respective independent compartments, the number and length of the heat pipes connected with the compartments can be adjusted. For example, the compartment with larger capacity can be connected with two heat pipes. Alternatively, one compartment can be connected with two heat pipes, while the other can be connected with one single heat pipe. In this case, the length of the two heat pipes is shorter than the length of the single heat pipe.

In conclusion, the present invention has independent compartments connected with multiple heat pipes to provide both the heat spreading function of a vapor chamber and the remote end heat transfer function of a heat pipe. Moreover, after heated, multiple independent vapor-liquid circulations take place within the compartments and the heat pipe chambers to transfer heat. Accordingly, the thermal module of the present invention is able to provide best heat dissipation effect for a heat source over which the heat is non-uniformly distributed. In addition, according to the structure of the thermal module of the present invention, the capacity of the compartment is enlarged to increase the amount of the working fluid contained in the compartment. This can increase the maximum heat transfer (Qmax) of the heat pipe.

The present invention has been described with the above embodiments thereof and it is understood that many changes and modifications in the above embodiments can be carried out without departing from the scope and the spirit of the invention that is intended to be limited only by the appended claims.

What is claimed is:

1. A thermal module used to contact a heat source with a heat surface, the thermal module comprising a vapor chamber having multiple sub-vapor chambers, each vapor chamber comprising an independent compartment, adjoining each other, and a single partition board disposed between each two sub-vapor chambers to partition the sub-vapor chambers, each sub-vapor chamber communicating with an open end of at least one independent heat pipe extending laterally from a side of each sub-vapor chamber, the open end communicating with a heat pipe chamber in the heat pipe, whereby the sub-vapor chambers communicate with separate heat pipe chambers, respectively;

wherein the heat surface of the heat source has a plurality of sections having different temperatures, and a sub-vapor chamber is respectively in alignment and contact with each of the plurality of different temperature sections of the heat surface of the heat source.

2. The thermal module as claimed in claim 1, wherein the sub-vapor chambers have equal or unequal capacities.

3. A thermal module used to contact a heat source with a heat surface, the thermal module comprising:

a vapor chamber having multiple sub-vapor chambers, each sub-vapor chamber comprising an independent compartment, adjoining each other, and a single partition board in between each two sub-vapor chambers to partition the sub-vapor chambers, and each sub-vapor chamber containing therein a separate working fluid and the vapor chamber having a bottom section, one face of the bottom section being a bottom face of the individual sub-vapor chambers, the other face of the bottom section being a heat contact face; and multiple independent first heat pipes, each first heat pipe being connected with and extending laterally from a side of one of the sub-vapor chambers, each first heat pipe having a first open end and a first closed end opposite to the first open end, the first heat pipe defining a first heat pipe chamber therein in communication with the first open end, the first open end and the first heat pipe chamber communicating with the sub-vapor chambers, wherein vapor-liquid circulations of the working fluids contained in the sub-vapor chambers independently operate within the sub-vapor chambers and the first heat pipe chambers to provide both the heat spreading function of the vapor chamber and the remote end heat transfer function of the heat pipes;

wherein the heat surface of the heat source has a plurality of sections having different temperatures, and a sub-vapor chamber is respectively in alignment and contact with each of the plurality of different temperature sections of the heat surface of the heat source.

4. The thermal module as claimed in claim 3, further comprising multiple independent second heat pipes, each second heat pipe being connected with one of the independent compartments, each second heat pipe having a second open end and a second closed end opposite to the second open end, the second heat pipe defining a second heat pipe chamber therein in communication with the second open end, the second open end and the second heat pipe chamber communicating with the compartment, whereby vapor-liquid circulations of the working fluids contained in the independent compartments independently take place within the independent compartments and the second heat pipe chambers to transfer heat.

5. The thermal module as claimed in claim 3, wherein the first heat pipes are circular heat pipes, flat-plate heat pipes, D-shaped heat pipes or semicircular heat pipes.

6. The thermal module as claimed in claim 4, wherein the second heat pipes are circular heat pipes, flat-plate heat pipes, D-shaped heat pipes or semicircular heat pipes.

7. The thermal module as claimed in claim 3, wherein the housing has a top section, the sub-vapor chambers being positioned between the top section and the bottom section and isolated from each other in a horizontal direction.

8. The thermal module as claimed in claim 7, wherein one face of the top section serves as a top face of the sub-vapor chambers.

9. The thermal module as claimed in claim 3, wherein the housing is formed with multiple perforations in communication with the sub-vapor chambers respectively, the first open ends of the first heat pipes being connected to the perforations respectively.

10. The thermal module as claimed in claim 4, wherein the housing is formed with multiple perforations in communication with the independent compartments respectively, the first open ends of the first heat pipes and the second open ends of the second heat pipes being connected to the perforations respectively.

11. The thermal module as claimed in claim 1, wherein the independent compartments have equal or unequal capacities.

12. The thermal module as claimed in claim 1, wherein the sub-vapor chambers have unequal capacities.

13. The thermal module as claimed in claim 3, wherein the sub-vapor chambers have unequal capacities.

* * * * *